United States Patent
Takahashi et al.

[19]

[11] Patent Number: 5,889,572
[45] Date of Patent: Mar. 30, 1999

[54] LIQUID CRYSTAL DISPLAY DEVICE

[75] Inventors: Hiroyuki Takahashi; Takayuki Iura, both of Mobara; Yoshio Sugaya, Ichihara, all of Japan

[73] Assignees: Hitachi, Ltd., Tokyo; Hitachi Device Engineering Co., Ltd., Mobara, both of Japan

[21] Appl. No.: 720,416

[22] Filed: Sep. 30, 1996

[30] Foreign Application Priority Data

Oct. 26, 1995 [JP] Japan .................................. 7-278629

[51] Int. Cl.6 ...................... G02F 1/1345; G02F 1/1333
[52] U.S. Cl. ........................ 349/149; 349/58; 349/150
[58] Field of Search ........................... 349/58, 149, 150, 349/151, 152; 345/206; 439/65, 67, 68, 74, 76, 77; 361/681, 716, 789, 792, 796, 749, 752

[56] References Cited

U.S. PATENT DOCUMENTS 5,606,440 2/1997 Kawaguchi et al. ................... 349/150
5,680,183 10/1997 Sasuga et al. ............................ 349/58
5,689,352 11/1997 Kishigami et al. ..................... 349/149
5,757,450 5/1998 Fujii et al. .............................. 349/151
5,777,610 7/1998 Sugimoto et al. ...................... 345/206

*Primary Examiner*—William L. Sikes
*Assistant Examiner*—Tai V. Duong
*Attorney, Agent, or Firm*—Antonelli, Terry, Stout & Kraus, LLP

[57] ABSTRACT

A liquid crystal display device which reduces the width of the frame and effectively utilizes the corner of the device. The liquid crystal display device comprises a liquid crystal display element; printed circuit boards arranged along at least two adjoining sides of the liquid crystal display element and mounting electronic components to drive the liquid crystal display element; a case to accommodate the liquid crystal display element and the printed circuit boards; and an interconnect board provided at the corner made by the two sides of the liquid crystal display element to electrically connect the printed circuit boards, the interconnect board being arranged to overlap the liquid crystal display element.

6 Claims, 8 Drawing Sheets

LIQUID CRYSTAL DISPLAY DEVICE

BACKGROUND OF THE INVENTION

The present invention relates to a liquid crystal display device used as a display section of information processing equipment for outputting information and images and as a display section of data transmission equipment for displaying information and images. More specifically, this invention relates to a liquid crystal display device that has an area in which to provide a drive circuit for driving a display area of a liquid crystal display element.

FIG. 2 shows an example of a conventional liquid crystal display device having a circuit for driving the liquid crystal display element 100, which is almost rectangular. The drive circuit for driving the liquid crystal display element is provided along the sides of the liquid crystal display element. Designated 600 is a printed circuit board on which electronic circuits are printed and whose outputs are connected to respective terminals of the liquid crystal display element through semiconductor ICs 200 formed by the tape carrier method. The printed circuit board is divided for each side of the liquid crystal display element, and the corners formed by two adjoining rectangular sides of th e liquid crystal display element are provided with an interconnect board that electrically connects the divided printed circuit boards.

The liquid crystal display element equipped with such a drive circuit is housed in a rectangular case, which has a display window through which one can observe the display area of the liquid crystal display element. The area ranging from the display window to the periphery of the case is normally called a frame. The area occupied by this frame contains the above-mentioned circuit boards, semiconductor ICs and interconnect boards.

There are, however, demands made of the conventional liquid crystal display devices for minimize the width of the frame to eliminate redundant spaces and thereby improve appearance of the display device.

Further problems with the conventional liquid crystal display devices are that the interconnect boards arranged at the peripheral corners of the liquid crystal display element hinder the frame width at the peripheral corners from being reduced and that components other than the interconnect boards cannot be placed at the peripheral corners of the liquid crystal display element.

SUMMARY OF THE INVENTION

The present invention has been accomplished under these circumstances and a primary object of this invention is to provide a liquid crystal display device which can reduce the so-called frame area. Another object of this invention is to provide a liquid crystal display device which can make effective use of areas at the corner peripheries of the liquid crystal display element.

To achieve the above objectives, the liquid crystal display device according to one aspect of this invention comprises: a liquid crystal display element; a printed circuit board mounting electronic components for driving the liquid crystal display element; a case accommodating the liquid crystal display element and the printed circuit board; printed circuit boards arranged along at least two adjoining sides of the liquid crystal display element; and an interconnect board arranged at the corner formed by the two sides of the liquid crystal display element to electrically connect the printed circuit boards, with the interconnect board and the liquid crystal display element being arranged overlapping each other.

DETAILED DESCRIPTION OF THE EMBODIMENTS

Figure 1:
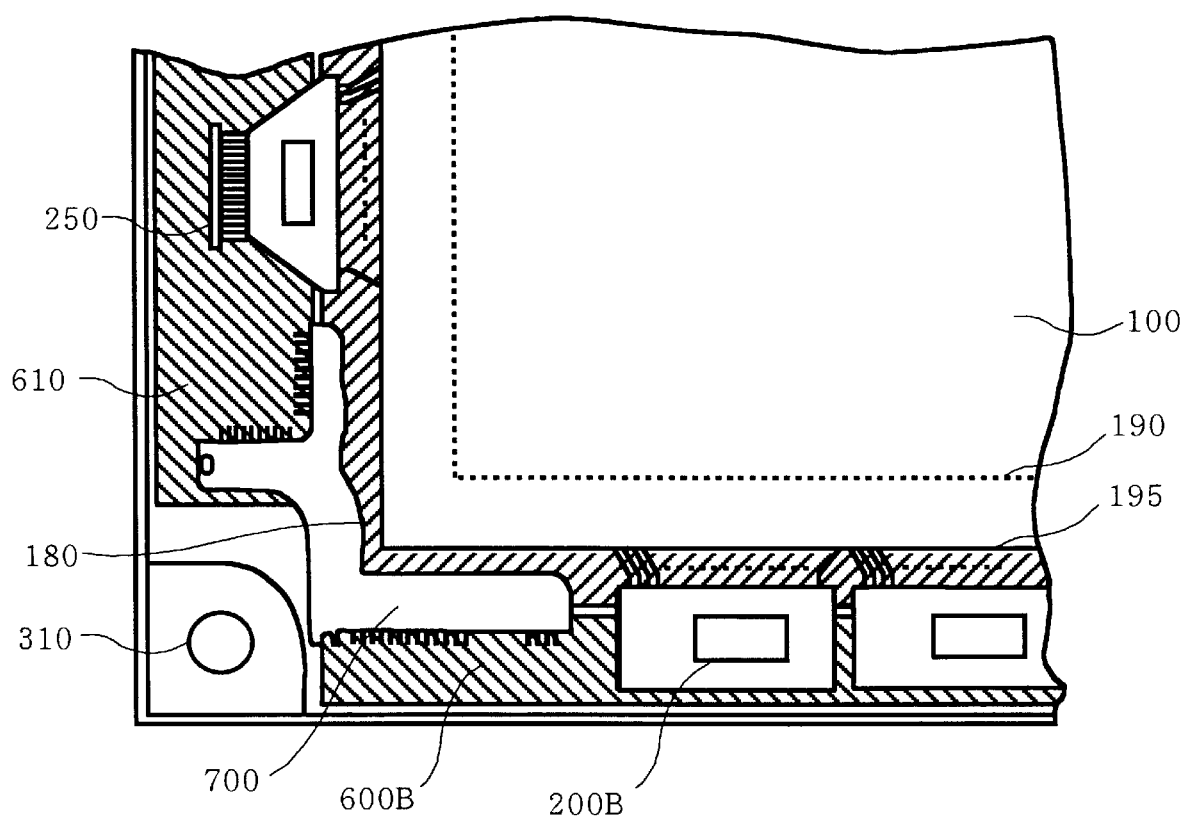
FIG. 1 is a partial plan view showing a liquid crystal display device of this invention.
Figure 2:
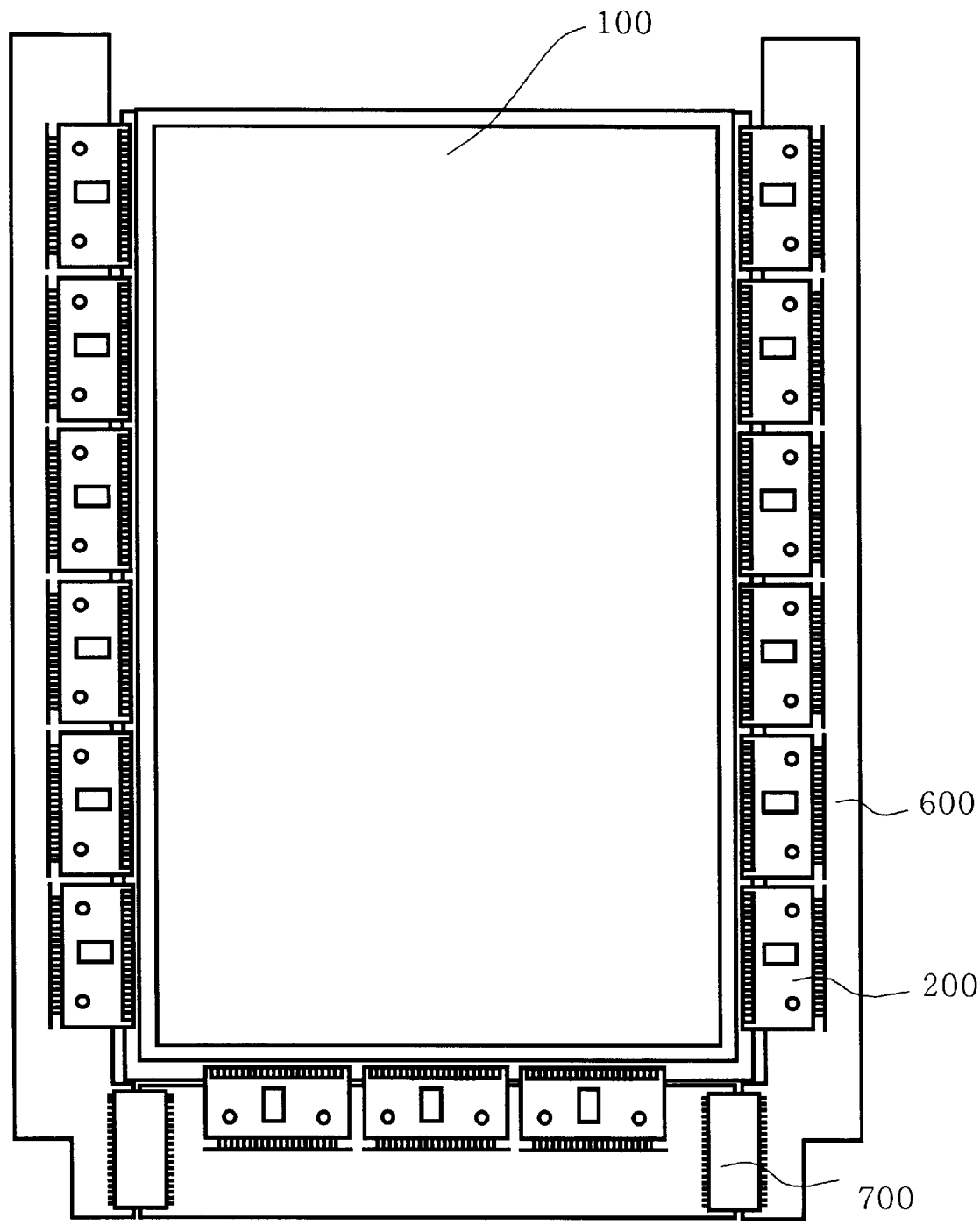
FIG. 2 is a plan view showing a conventional liquid crystal display device.

Now, preferred embodiments of the liquid crystal display device according to this invention will be described by referring to the accompanying drawings. In all the figures, components having the same functions are given like reference numerals and their explanations are not repeated.

Figure 3:
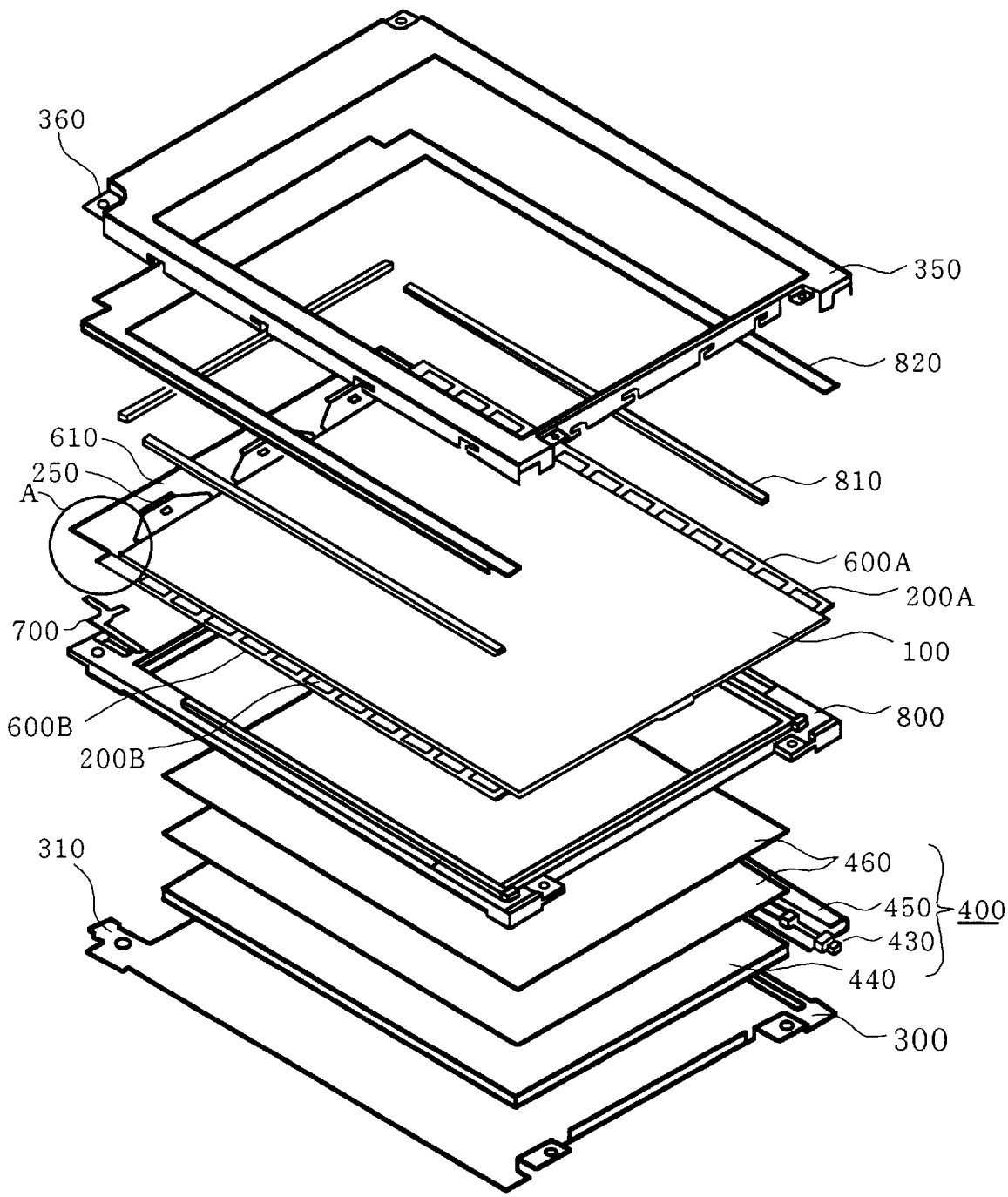
FIG. 3 is an exploded perspective view of the liquid crystal display device of this invention.

FIG. 3 is an exploded perspective view of one embodiment of the liquid crystal display device of this invention. Around the periphery of a liquid crystal display element 100 are arranged printed circuit boards 600A, 600B, 610. The printed circuit boards and the liquid crystal display element are connected to each other through semiconductor ICs 200A, 200B, 250 formed by the tape carrier method. The liquid crystal display element connected with the printed circuit boards is held in a frame-like mold 800 and clamped between an upper case 350 and a lower case 300. The upper case 350 and the lower case 300 have fixing portions 360, 310 respectively to secure them together. Below the liquid crystal display element 100 is provided a backlight 400 for the liquid crystal display device. The backlight comprises a cold cathode fluorescent lamp 430; a light conducting plate 440 made of an acrylic plate to throw light from the cold cathode fluorescent lamp uniformly over the liquid crystal display element; a reflection plate 450 made of a metal plate coated with a white paint; and a milk-color diffusion plate 460 to disperse light from the light conducting plate. A corner portion A of the liquid crystal display element is provided with a flexible interconnect board 700 that makes electrical connection between the printed circuit boards 600B and 610.

Figure 4:
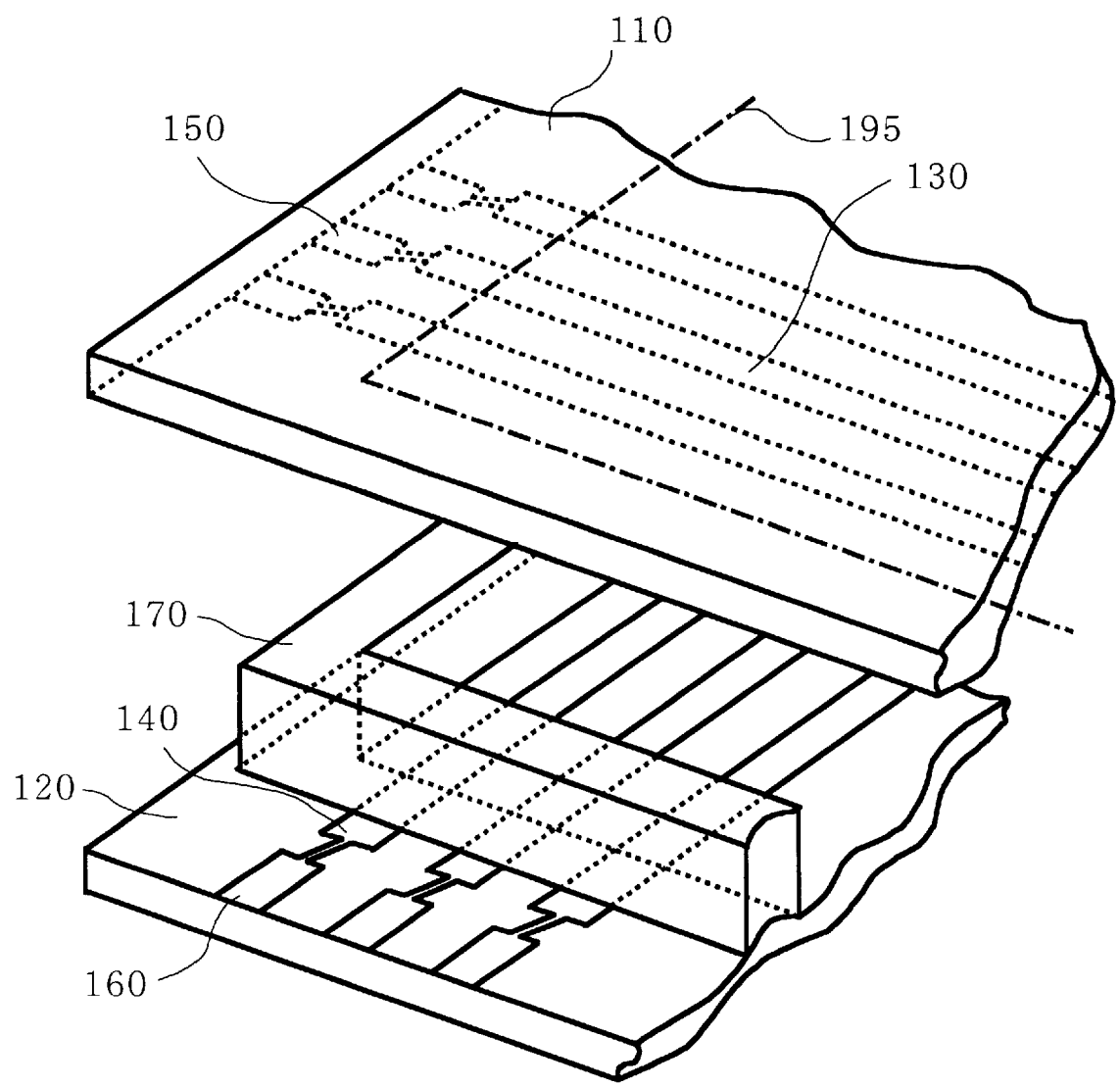
FIG. 4 is a schematic, perspective view of the liquid crystal display device of this invention.

FIG. 4 is a perspective view showing the outline configuration of the liquid crystal display element used on the liquid crystal display device of this invention. In FIG. 4, denoted 120 is a segment electrode substrate, 110 a common electrode substrate, 140 segment electrodes, 130 common electrodes, and 170 a seal member. The common electrode substrate 110 is a virtually rectangular transparent substrate, such as glass, formed with a plurality of transparent common electrode strips 130.

Likewise, the segment electrode substrate 120 is a virtually rectangular transparent substrate, such as glass, formed with a plurality of transparent segment electrode strips 140.

Outside the common electrode substrate 110 and the segment electrode substrate 120 are provided polarizing plates not shown. Designated 195 is an area where the polarizing plate is placed on the common electrode substrate 110.

The liquid crystal display element shown in FIG. 4 has the segment electrode substrate 120 and the common electrode substrate 110 stacked together with the seal member 170 interposed therebetween so that the opposing substrates are spaced a predetermined distance. The seal member is provided along the edges of the segment and common electrode substrates, and these three members are bonded to form a container, which is sealed with a liquid crystal.

As shown in FIG. 4, the common electrodes and the segment electrodes are set perpendicular to each other, with intersecting points of the common electrodes and the segment electrodes each forming one pixel.

The common electrodes 130 and the segment electrodes 140 extend to the peripheries of the common electrode substrate 110 and the segment electrode substrate 120, respectively, to form external connection terminals 150 and 160.

Because in the liquid crystal display element 100, the virtually rectangular common electrode substrate 110 and segment electrode substrate 120 are stacked together so that the common electrodes 130 and the segment electrodes 140 cross each other, and because the external connection electrodes 150, 160 are provided at positions extended from the common electrodes and segment electrodes, the drive ICs 200A, 200B, 250 for driving the liquid crystal display element and the printed circuit boards 600A, 600B, 610 are provided at the peripheries of at least two sides of the liquid crystal display element. These printed circuit boards located at the two sides of the liquid crystal display element are electrically interconnected by the flexible interconnect board 700.

Figure 5:
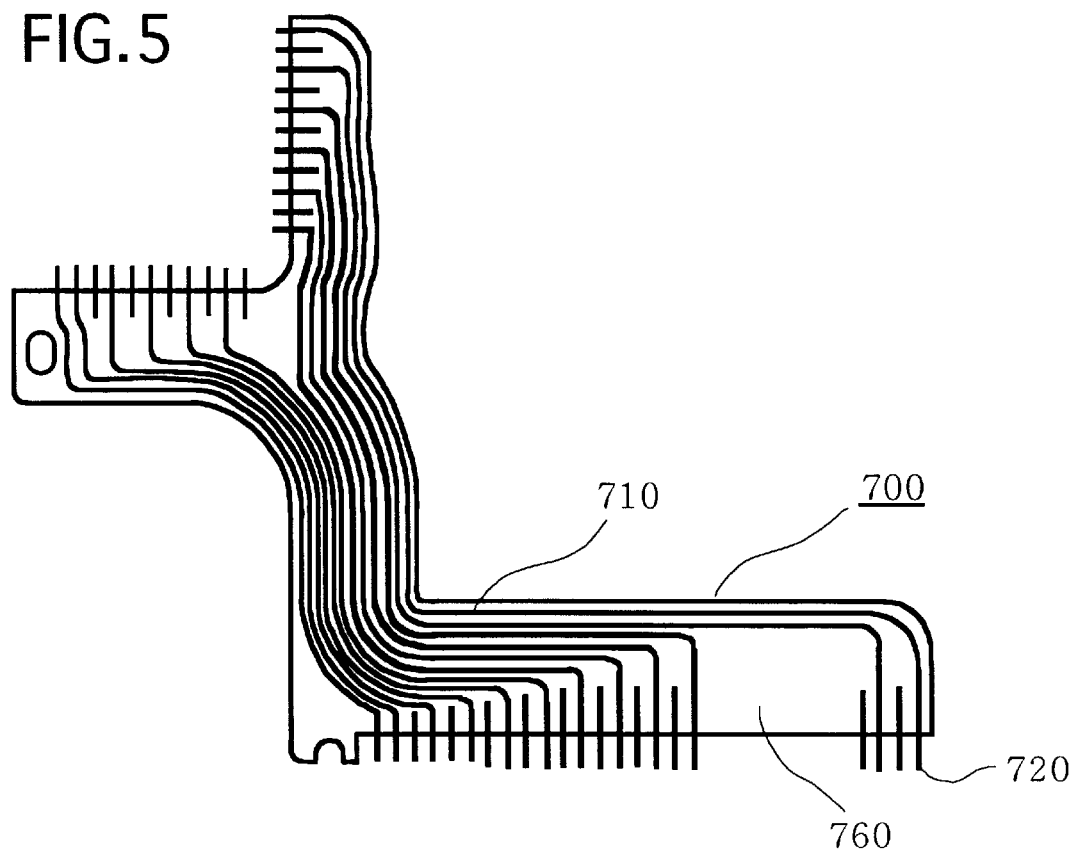
FIG. 5 is a plan view showing the surface of a flexible interconnect board of this invention.
Figure 6:
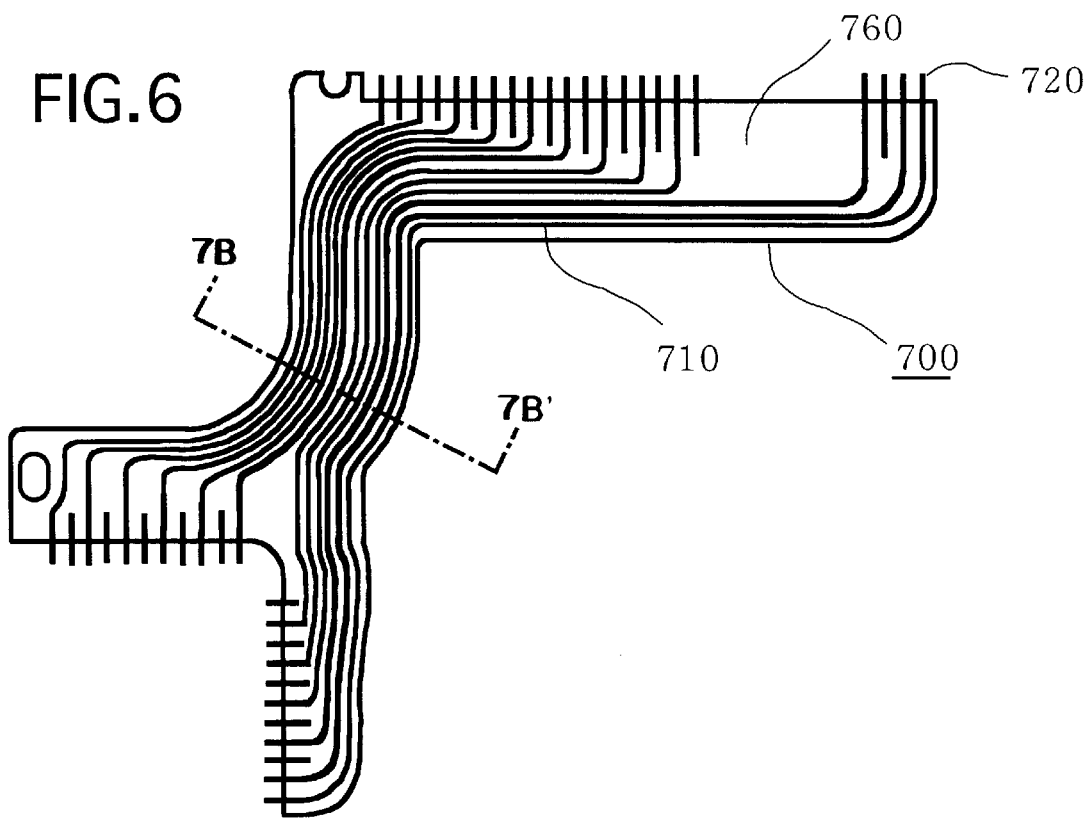
FIG. 6 is a plan view showing the back of the flexible interconnect board of this invention.
Figure 7:
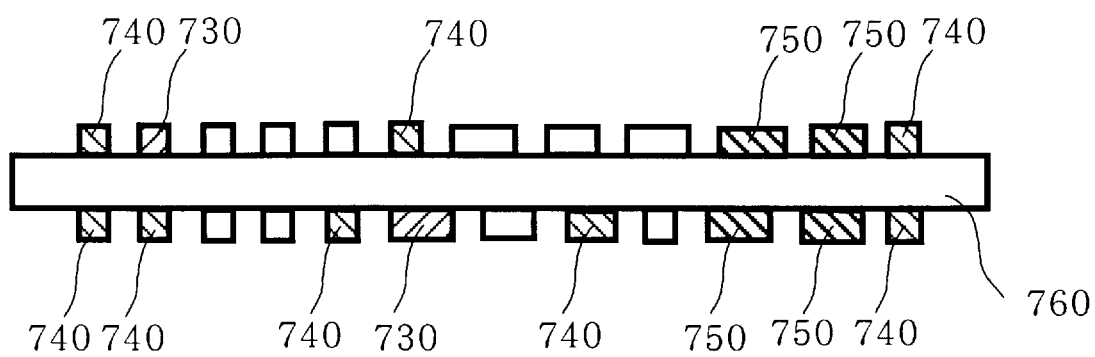
FIG. 7 is a cross section of the flexible interconnect board of this invention.

FIG. 5 shows a plan view of the flexible interconnect board of this invention as seen from the front and FIG. 6 shows the same as seen from the back. This flexible interconnect board 700 is made of a flexible substrate having conductive interconnects. As shown in FIG. 5 and 6, two layers of interconnect 710 are formed on the front and back of the flexible substrate 760. FIG. 7 shows a cross section taken along the line 7B—7B, of FIG. 6. The two layers of interconnect 710 are connected together at terminal portions 720, which are soldered to the printed circuit boards.

Figure 8:
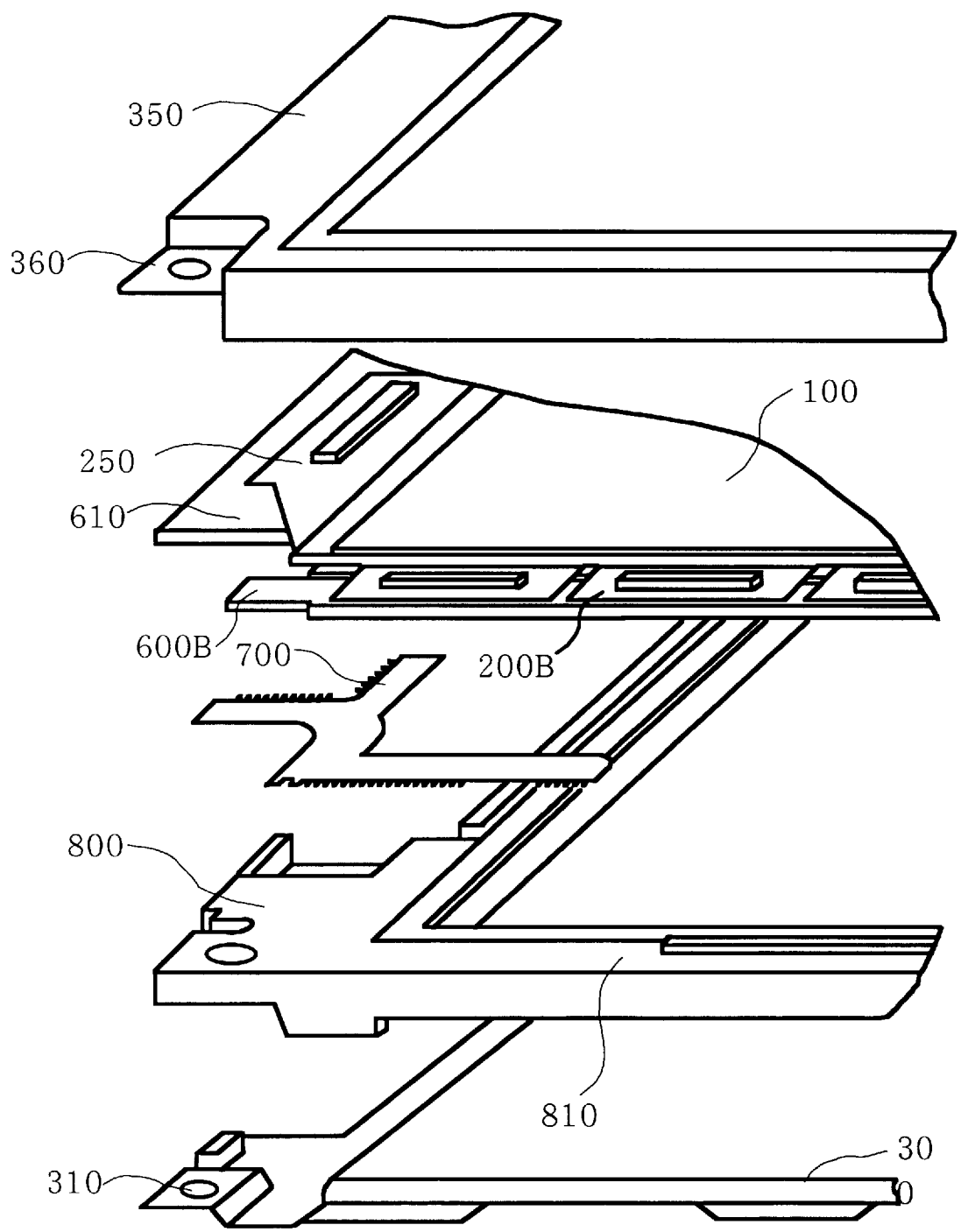
FIG. 8 is a schematic assembly diagram for the liquid crystal display device of this invention.

FIG. 8 shows a perspective enlarged view of the corner formed by the two adjoining sides of the liquid crystal display element of FIG. 3. In FIG. 8, the liquid crystal display element 100 is equipped with the drive ICs 200B, 250 by the tape carrier method. The drive ICs 200B, 250 are connected to the printed circuit boards 600B, 610, which are interconnected by the flexible interconnect board 700. The liquid crystal display element equipped with the drive circuits are held in the mold 800 and clamped between the upper case 360 and the lower case 300.

Referring to FIG. 8, the lower case 300, which forms a part of an outer frame body of the liquid crystal display device, is box-shaped and has a fixing portion 310 (described later) at the corner for fixing with the upper case.

Between the printed circuit board 610 and the liquid crystal display element 100 is arranged a common electrode drive circuit 250 made of semiconductor ICs by the tape carrier method, whose electrode terminals are connected at one end to the external connection terminals 150 of the common electrode substrate 110 and at the other to the electrode terminals on the common side printed circuit board 610.

The segment side printed circuit board 600B is arranged at the side of the segment electrode substrate of the liquid crystal display element 100 where the external connection terminals are provided.

Between the segment side printed circuit board 600B and the liquid crystal display element 100 is arranged a segment electrode drive circuit 200B made of semiconductor ICs by the tape carrier method, whose electrode terminals are connected at one end to the external connection terminals 160 of the segment electrode substrate 120.

The printed circuit boards 610 and 600B are separately formed and their longitudinal ends extend nearly engaging the fixing portion 310 of the lower case 300. This is because an attempt to set the areas of the printed circuit boards 610, 600B to more than a predetermined value and to reduce their widths as much as possible results in their lengths increasing to such an extent that their ends contact the fixing portion 310.

These printed circuit boards 610 and 600B need to be connected electrically and their connection is made through the flexible interconnect board 700.

FIG. 1 shows an enlarged view of the part A of FIG. 3. The flexible interconnect board 700 is arranged not to contact the fixing portion 310. It is bent along the corner made by two sides of the liquid crystal display element 100, with a part of the flexible board overlapping a nondisplay portion 180.

The reason that the interconnecting wires of the flexible interconnect board 700 are arranged overlapping the liquid crystal display element is that, in making efficient use of the limited space between the fixing portion 310 of the lower case 300 and the liquid crystal display element 100 close to the fixing portion 310, the above-mentioned arrangement of the flexible interconnect board 700 is the most effective. If, however, the flexible interconnect board 700 overlaps the display area 190 of the liquid crystal display element 100, the appearance of the display device is marred; therefore, measures are required to ensure that the flexible interconnect board 700 does not overlap the display area 190. Further, if the flexible interconnect board 700 overlaps a polarizing plate area 195, the thickness of the liquid crystal display device increases. It is therefore necessary to prevent it from overlapping the polarizing plate area 195. These impose limitations on the width of the flexible interconnect board 700 and, to allow many wires to be provided in a narrow width, the flexible interconnect board 700 has a multilayered structure.

In the two-layer wiring, as shown in FIG. 7, surrounding a high-frequency signal wire 730 with ground wires 740 can prevent leakage of high-frequency noise.

Further, to lower wire impedance and allow more current to flow, the power wire 750 and the ground wire 740 are formed wide.

Figure 9:
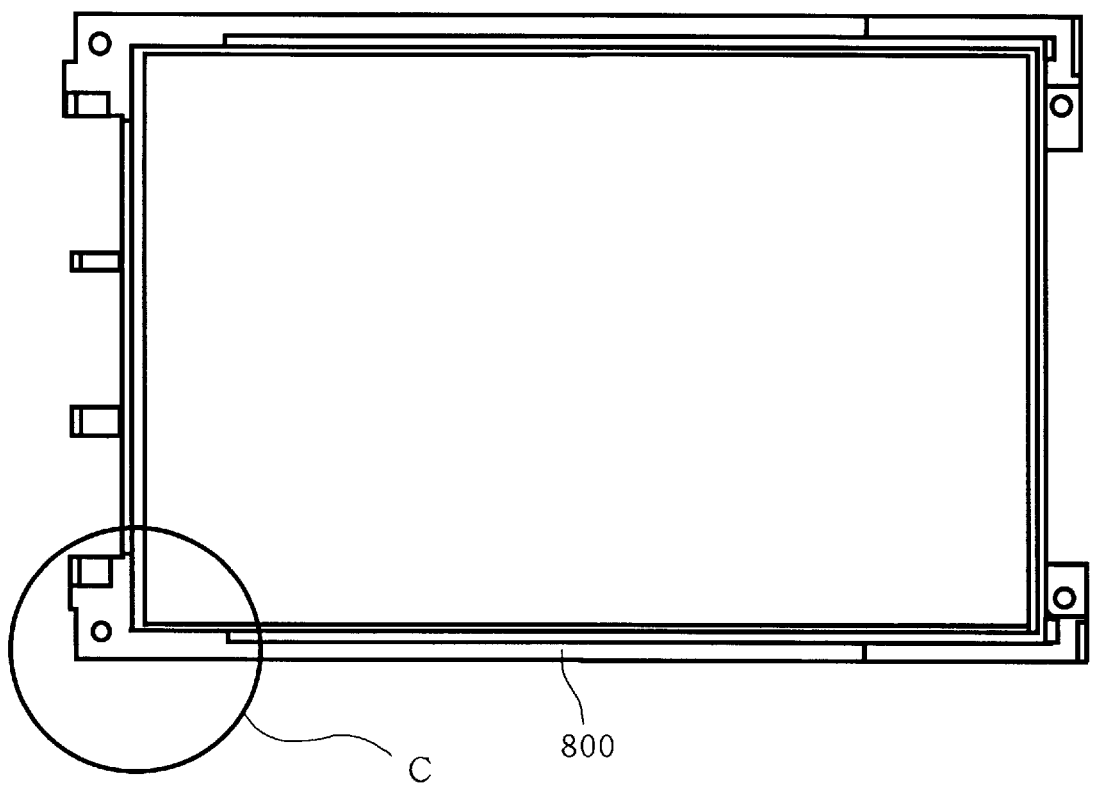
FIG. 9 is a plan view of a mold of this invention.
Figure 10:
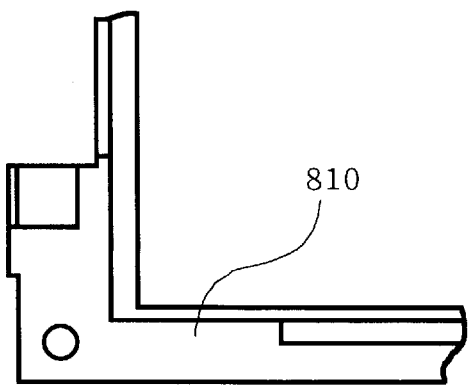
FIG. 10 is an enlarged view of one example of the mold of this invention.
Figure 11:
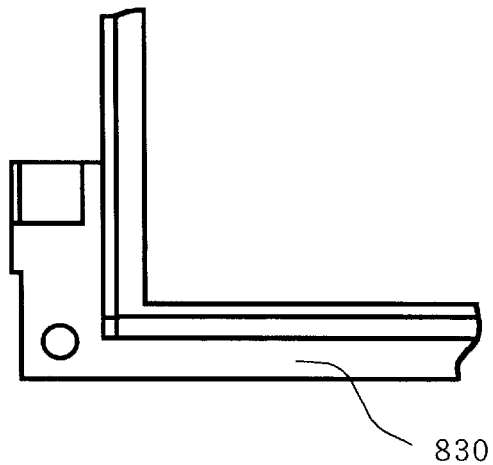
FIG. 11 is an enlarged view of a conventional mold.

Because the flexible interconnect board 700 and the liquid crystal display element are overlapped, a part 810 of the mold 800 where the flexible interconnect board 700 is arranged is reduced in thickness by an amount equal to the thickness of the flexible interconnect board. FIG. 9 shows the mold 800 used in this invention. FIG. 10 shows an enlarged view of part C of FIG. 9. FIG. 11 shows an enlarged view of part C of the conventional mold. Compared with the conventional mold 830, the mold 800 of this invention is reduced in thickness in an area 810 of FIG. 10 by an amount equal to the thickness of the flexible interconnect board 700.

As is evident from the above description, the liquid crystal display device of this invention can make effective use of the limited space between the fixing portion of the lower case and the adjacent liquid crystal display element because the flexible interconnect board is arranged to overlap the liquid crystal display element.

This arrangement eliminates the need to increase the space (width) between the liquid crystal display element and the frame wall of the lower case, offering the advantage of being able to reduce the width from that of the conventional device.

In the liquid crystal display device with the above configuration, because the wires of the interconnect board at the corner of the liquid crystal display element is arranged overlapping the liquid crystal display element, it is possible to provide members other than the interconnect board at the corner of the liquid crystal display element. Hence, the limited space at the corner of the liquid crystal display element can be utilized effectively.

Further, because there is no need to increase the width between the liquid crystal display element and the frame of the case that accommodates the liquid crystal display element, the width can be made smaller than that of the conventional device.

What is claimed is:

1. A liquid crystal display device comprising:
   a liquid crystal display element;
   a first printed circuit board and a second printed circuit board, arranged along at least two adjoining sides of the liquid crystal display element; and
   an interconnect board provided at a corner made by the two sides of the liquid crystal display element to electrically connect the first printed circuit board and the second printed circuit board, the interconnect board being arranged to overlap the corner made by the two sides of the liquid crystal display element.

2. A liquid crystal display device comprising:
   a liquid crystal display element;
   an upper case and a lower case, holding the liquid crystal display element between them;
   printed circuit boards arranged along at least two adjoining sides of the liquid crystal display element to drive the liquid crystal display element;
   a flexible interconnect board provided at the corner made by the two sides of the liquid crystal display element to electrically connect the printed circuit boards; and
   a fixing portion provided at the corner of the liquid crystal display element to fix together the upper case and the lower case;
   wherein the flexible interconnect board is provided between the fixing portion and the liquid crystal display element.

3. A liquid crystal display device comprising:
   a liquid crystal display element;
   printed circuit boards arranged along at least two adjoining sides of the liquid crystal display element to drive the liquid crystal display element, the two adjoining sides crossing virtually at right angles; and
   a flexible interconnect board provided at a corner made by the two virtually perpendicular sides of the liquid crystal display element to electrically connect the printed circuit boards, the flexible interconnect board being arranged to overlap the liquid crystal display element and extend in two virtually perpendicular directions along the two virtually perpendicular sides of the liquid crystal display element.

4. A liquid crystal display device comprising:
   a liquid crystal display element;
   printed circuit boards arranged along at least two adjoining sides of the liquid crystal display element to drive the liquid crystal display element, the two adjoining sides crossing virtually at right angles; and
   a flexible interconnect board provided at a corner made by the two virtually perpendicular sides of the liquid crystal display element to electrically connect the printed circuit boards, the flexible interconnect board being arranged to overlap the liquid crystal display element and having wires constructed in multiple layers.

5. A liquid crystal display device according to claim 4, wherein the multilayered flexible interconnect board for electrically connecting the printed circuit boards has signal wires and power wires used to drive the liquid crystal display element, the signal wires being surrounded by the power wires.

6. A liquid crystal display device comprising:
   a liquid crystal display element;
   printed circuit boards arranged along at least two adjoining sides of the liquid crystal display element to drive the liquid crystal display element, the two adjoining sides crossing virtually at right angles;
   a flexible interconnect board provided at a corner made by the two virtually perpendicular sides of the liquid crystal display element to electrically connect the printed circuit boards; and
   a mold to hold the liquid crystal display element, the printed circuit boards and the flexible interconnect board;
   wherein the flexible interconnect board is arranged to overlap the liquid crystal display element and the mold is reduced in thickness by an amount equal to or greater than the thickness of the flexible interconnect board at an area where the flexible interconnect board and the liquid crystal display element overlap each other.

* * * * *